US012787815B2

(12) United States Patent
Sakairi et al.

(10) Patent No.: US 12,787,815 B2
(45) Date of Patent: Nov. 3, 2026

(54) INTERPOSER SUBSTRATE AND METHOD FOR PRODUCING DEVICE USING THE INTERPOSER SUBSTRATE

(71) Applicant: TANAKA KIKINZOKU KOGYO K.K., Tokyo (JP)

(72) Inventors: Koichi Sakairi, Isehara (JP); Toshinori Ogashiwa, Isehara (JP); Mitsutomo Nishizawa, Sendai (JP)

(73) Assignee: TANAKA PRECIOUS METAL TECHNOLOGIES Co., Ltd., Tokyo (JP)

( * ) Notice: Subject to any disclaimer, the term of this patent is extended or adjusted under 35 U.S.C. 154(b) by 501 days.

(21) Appl. No.: 18/269,456

(22) PCT Filed: Dec. 13, 2021

(86) PCT No.: PCT/JP2021/045776
§ 371 (c)(1),
(2) Date: Jun. 23, 2023

(87) PCT Pub. No.: WO2022/138271
PCT Pub. Date: Jun. 30, 2022

(65) Prior Publication Data
US 2024/0321705 A1 Sep. 26, 2024

(30) Foreign Application Priority Data
Dec. 25, 2020 (JP) ................................ 2020-216194

(51) Int. Cl.
*H10W 70/60* (2026.01)
*H10W 70/63* (2026.01)
(Continued)

(52) U.S. Cl.
CPC ......... *H10W 70/635* (2026.01); *H10W 70/66* (2026.01); *H10W 90/701* (2026.01); *H10W 72/07232* (2026.01)

(58) Field of Classification Search
CPC ........ H01L 23/49827; H01L 23/49811; H10W 70/635; H10W 90/701; H10W 70/095
See application file for complete search history.

(56) References Cited

U.S. PATENT DOCUMENTS

| | | | |
|---|---|---|---|
| 2005/0190808 | A1 | 9/2005 | Yonekura et al. |
| 2016/0272488 | A1 | 9/2016 | Ogashiwa et al. |
| 2021/0066180 | A1 | 3/2021 | Fukuzono et al. |

FOREIGN PATENT DOCUMENTS

| | | | |
|---|---|---|---|
| CN | 111033771 | A | 4/2020 |
| JP | 2000-151060 | A | 5/2000 |

(Continued)

OTHER PUBLICATIONS

Taiwanese Patent Office, “Office Action,” issued in connection with Taiwanese Patent Application No. 110146957, dated Aug. 12, 2022.
International Searching Authority, “International Search Report,” issued in connection with International Patent Application No. PCT/JP2021/045776, dated Mar. 8, 2022.

(Continued)

*Primary Examiner* — Michele Fan
(74) *Attorney, Agent, or Firm* — Foley & Lardner LLP

(57) ABSTRACT

The interposer substrate is joined in an overlapping state to one or more members having a connection part at one place or more, and electrically connected to the member. The interposer substrate includes a base material having one or more connection regions corresponding to connection parts of the member to be joined. A plurality of through-holes are formed in the connection region. A segment as one unit for electrical connection is constituted by forming the plurality of through-holes adjacent to each other. One or more seg-
(Continued)

ments are formed in the connection region. In the through-hole are formed a through electrode and a bump with a wide width formed at an end of the through electrode. The through electrode and bump are composed of a metal powder sintered body formed by sintering a metal powder including gold or the like having a predetermined purity and average particle size.

14 Claims, 11 Drawing Sheets

(51) Int. Cl.

| | |
|---|---|
| ***H10W 70/66*** | (2026.01) |
| ***H10W 90/00*** | (2026.01) |
| *H10W 72/00* | (2026.01) |

(56) References Cited

FOREIGN PATENT DOCUMENTS

| | | | | | |
|---|---|---|---|---|---|
| JP | 2000-228566 | A | | 8/2000 | |
| JP | 2004-342888 | A | | 12/2004 | |
| JP | 2009-295635 | A | | 12/2009 | |
| JP | 2015-095572 | A | | 5/2015 | |
| KR | 101225451 | B1 | * | 1/2013 | ............. H01L 23/12 |
| TW | I541949 | B | | 7/2016 | |

OTHER PUBLICATIONS

International Searching Authority, "Written Opinion," issued in connection with International Patent Application No. PCT/JP2021/045776, dated Mar. 8, 2022.

Office Action issued in corresponding Japanese Patent Application No. 2020-216194 dated May 27, 2024 (5 pages).

* cited by examiner

SUBSTRATE
DRILLING
THROUGH-HOLE
SUBSTRATE

METALLIZED FILM
MASKING
MASK PATTERN

METAL PASTE

METAL PASTE
SINTERING
THROUGH ELECTRODE + BUMP
(METAL POWDER SINTERED BODY)

BUMP
THROUGH ELECTRODE
METAL PASTE

INTERPOSER SUBSTRATE AND METHOD FOR PRODUCING DEVICE USING THE INTERPOSER SUBSTRATE

CROSS-REFERENCE TO RELATED APPLICATIONS

The present application claims priority under 35 U.S.C. § 371 to International Patent Application No. PCT/JP2021/045776, filed Dec. 13, 2021, which claims priority to and the benefit of Japanese Patent Application No. 2020-216194, filed on Dec. 25, 2020. The contents of these applications are hereby incorporated by reference in their entireties.

BACKGROUND OF THE INVENTION

Field of the Invention

The present invention relates to an interposer substrate. In particular, the present invention relates to an interposer substrate which is useful in mounting technology for applying system-in-package techniques to high-output semiconductor devices such as power devices or for stack-mounting such high-output semiconductor devices, and which has durability with respect to thermal stress caused by heat generation of a device or a thermal cycle.

Description of the Related Art

To meet the need for size reduction and higher integration of semiconductor devices, 2.5D mounting that utilizes an interposer substrate has come into practical use as a mounting technique for semiconductor chips. In this mounting method, semiconductor chips and a circuit board are connected in the thickness direction through an interposer substrate to thereby achieve higher integration of semiconductor chips and also achieve high-speed transmission of signals between chips.

An interposer substrate is an intermediate substrate in which through electrodes are formed at positions corresponding to connection parts such as bumps of a semiconductor chip, on a base material made of silicon or glass or the like. The through electrodes of the interposer substrate are produced by forming an electric conductor inside through-holes formed in the base material. An electrode formed by filling (via filling) a through-hole with a conductive metal such as copper (Cu) by plating, and an electrode formed by coating the inner face of a through-hole with a conductive metal film without filling the entire hole and the like are known as such kinds of through electrode.

In this connection, the range of semiconductor devices for which size reduction and higher integration are demanded is expanding further, and these demands are also increasing with respect to high-current and high-load semiconductor devices such as power devices and LED devices. In recent years, together with a rise in the demand for power devices against a background of widespread use of EV, PHEV and HEV and the quick chargers for these vehicles and the like in the automobile field and the widespread use of solar energy power generation systems and mega solar systems and the like in the energy field, there is also an increasing need for size reduction and higher integration of these devices. Therefore, application of mounting technology that utilizes the interposer substrates described above is thought of as a way to meet such demands for a reduction in the size of power devices and the like.

PRIOR ART DOCUMENTS

Patent Document

Patent Document 1

Japanese Patent Application Laid-Open No. 2004-342888

Patent Document 2

Japanese Patent Application Laid-Open No. 2000-151060

Patent Document 3

Japanese Patent Application Laid-Open No. 2000-228566

SUMMARY OF THE INVENTION

However, the aforementioned mounting technology that utilizes an interposer substrate has been mainly applied to semiconductor devices with comparatively low current driving in which the amount of heat generation is small, such as for memory (stacked memory) or PCs for server use and graphics use. Further, there are many negative views with regard to whether or not it is possible to apply the conventional interposer substrates to power devices and the like. This is because a semiconductor device for power conversion and control of a power device or the like is liable to be driven with a large current and the operating temperature is also liable to become a high temperature. In particular, it is predicted that a thermal cycle which occurs due to driving of the device being turned on and off will have a profound effect on the interposer substrate. In a semiconductor device, the coefficient of thermal conductivity and coefficient of thermal expansion of a member to be joined such as a semiconductor chip are different from the coefficient of thermal conductivity and coefficient of thermal expansion of a base material and a through electrode constituting an interposer substrate. Further, there is a risk that breakage or a connection failure will occur in the through electrode due to thermal stress attributable to the differences between these coefficients. It is predicted that such influence will be especially large in a semiconductor device in which the amount of heat generation is large such as a power device. Therefore, the number of reported cases of the application of interposer substrates that can support power devices and the like up to now is few, and there has been no choice but to depend on use of the conventional surface mounting as the method for mounting such interposer substrates.

Therefore, an object of the present invention is to provide an interposer substrate which enables the application of system-in-package techniques and three-dimensional stacked mounting to semiconductor devices, in particular, active devices such as a power device, and which is excellent in durability under high temperatures and in a state in which there is a severe thermal cycle. Further, a method for producing a device that applies a mounting method with this interposer substrate is also disclosed.

The present invention that solves the problem described above is drawn to an interposer substrate which is joined in an overlapping state to one or a plurality of members to be joined having a connection part at one or more places, and is electrically connected to the member to be joined, the interposer substrate including a base material having one or more connection regions corresponding to the connection part of the member to be joined, wherein: a plurality of through-holes which pass through the base material are formed in the connection region of the base material; a segment which serves as one unit for the connection is constituted by the plurality of through-holes being formed adjacent to each other, with one or more of the segments being formed in the connection region; a through electrode that passes through the through-hole, and a bump which is formed at least at one end of the through electrode and which, in a cross-sectional shape, has a wider width than the through electrode are formed in each of the through-holes; and the through electrode and the bump include a metal powder sintered body formed by sintering one or more kinds of metal powder selected from gold, silver and copper having a purity of 99.9% by mass or more and an average particle size of 0.005 μm to 2.0 μm.

With respect to thermal stress to which a through electrode is subjected that is caused by thermal cycles of a semiconductor device, the present inventors suppress the influence of such thermal stress by two means to thereby impart durability to an interposer substrate. As the first means, in the present invention, through electrodes are constituted by a plurality of small-diameter through electrodes. In a conventional interposer substrate, one or a plurality of through electrodes are formed depending on the structure and area and the like of a connection part which a member to be joined such as a semiconductor element includes. In the present invention, the aforementioned one through electrode of the prior art is referred to as "one unit of an electrical connection". In the interposer substrate of the present invention, a plurality of small-diameter through electrodes are provided, and one unit of an electrical connection is constituted by the plurality of small-diameter through electrodes. That is, whilst in the prior art one unit of an electrical connection is constituted by one through electrode, in the present invention, a plurality of through electrodes constitute one unit of an electrical connection. By dispersing the through electrodes in this way, thermal stress is divided up to thereby lessen the effect of the thermal stress.

Further, the second means for enhancing the durability of an interposer substrate in the present invention is improvement of the constituent material of the through electrode. In the conventional interposer substrates, a through electrode is generally formed by plating or the like. A metal that is formed of plating is dense and bulky and is hard, and there is a risk that the metal will break due to repeated stress. In the present invention, a through electrode is formed of a sintered body of metal powder having a predetermined particle size and purity. A sintered body of metal powder is a material whose structure and texture differ from that of a bulk metal, and which has flexibility, and is thought to have an action that relieves stress caused by thermal cycles. Thus, in the present invention, durability with respect to thermal cycles is also imparted from the aspect of the structure of the through electrode.

Hereunder, the structure of the interposer substrate and the method for producing the interposer substrate of the present invention, as well as a mounting technique that applies the interposer substrate of the present invention will be described. The basic configuration of the interposer substrate of the present invention consists of a base material and through-holes, through electrodes and bumps that are formed in the base material. To facilitate understanding of the following description, FIG. 1 and FIG. 2 illustrate an example of an interposer substrate of the present invention, and an example of a state in which the interposer substrate is joined to a member to be joined (a power module or the like).

A Interposer Substrate of Present Invention (I) Joining Target (Member to be Joined)

The interposer substrate of the present invention is joined to one or a plurality of members to be joined, and electrically connected to the members to be joined. The term "member to be joined" refers to a semiconductor element, an integrated circuit, a power module, a multi-chip module, a circuit board or the like that constitutes a semiconductor device. In the case of joining to one member to be joined, the member to be joined is overlapped on and joined to any side of the interposer substrate. Further, in a case of joining to two or more members to be joined, the interposer substrate is sandwiched between and joined to a pair of the members to be joined. At this time, an electrical connection between the members to be joined is enabled through the interposer substrate. Further, a plurality of members to be joined may be joined to one side of the interposer substrate.

The member to be joined has one or more connection parts for making an electrical connection (see FIG. 1). The term "connection part" refers to a conductor for making an electrical connection, such as an electrode, an electrode pad (bump), wiring, a terminal or the like that is set and formed on a semiconductor element, an integrated circuit, a multi-chip module, a circuit board or the like that is the member to be joined, and the shape and dimensions thereof are not particularly limited.

(II) Base Material

A base material is a principle constituent member of the interposer substrate on which one or more members to be joined are three-dimensionally mounted. On the surface of the base material, a connection region is set at a position corresponding to the connection part of the member to be joined that is described above (see FIG. 1). The connection region on the base material is set so as to overlap with the connection part of the member to be joined when the base material and the member to be joined are overlapped on each other at the time of mounting (see FIG. 2). The connection region includes one or more segments constituted by a plurality of through-holes that are described later. A joining region is a region that is virtually set on a substrate, and it is not necessary for the joining region to be marked out by demarcation lines or concavities and convexities or the like that are visually recognized and ascertained in the outer appearance of the base material. It suffices that the joining region is a virtual region for determining the arrangement of segments (through-holes and through electrodes) with respect to the design of the interposer substrate.

Similarly to the conventional interposer substrates, examples of the constituent material of the base material that may be mentioned include silicon with an oxide film, glass, a ceramic material, and resin. The base material may be composed of a single layer, or may have a structure in which a plurality of layers are laminated. Further, apart from first and second members to be joined, the base material may also contain a built-in passive element, logic circuit, and analogue circuit.

(III) Through-Hole

A plurality of through-holes are formed inside the joining region of the base material (see FIG. 1). Whilst in the conventional interposer substrates one through-hole is formed for one unit of an electrical connection with a connection part of a member to be joined, in the interposer substrate of the present invention one unit of an electrical connection is formed by a plurality of through electrodes provided in a plurality of small-diameter through-holes. As described above, this is to disperse and relieve thermal stress by means of the plurality of through electrodes. In the present invention, a group of a plurality of through-holes and through electrodes forming one unit of an electrical connection is referred to as a "segment". One or more segments are formed within the joining region of the base material, and one or more segments are joined with respect to one location of a connection part of a member to be joined. Note that, the number and arrangement pattern of segments that are formed in one joining region are not particularly limited, and can be arbitrarily set. Further, the number and arrangement pattern of through-holes (through electrodes) formed in one segment can also be arbitrarily set.

The diameter of the through-hole is preferably 10 μm or more and 100 μm or less. With regard to the hole diameter, when taking into consideration that the hole diameter of a through-hole in a conventional common interposer substrate is 200 μm or more, it is deemed that the aforementioned hole diameter is an adequately minute diameter. Further, there is no particular specification regarding the number of through-holes (through electrodes) to be formed in one segment. The number of through-holes (through electrodes) can be arbitrarily set based on the joining area and the area of through-holes that are required with respect to the connection part of the member to be joined. Further, although a plurality of through-holes are formed adjacent to each other to form a segment, the interval between through-holes in one segment is not particularly limited as long as the interval is shorter than a distance from an adjacent other segment.

(IV) Through Electrode

A through electrode is formed inside the above-described through-hole (see FIG. 2). The through electrode is formed of a metal powder sintered body made by sintering one or more kinds of metal powder selected from gold, silver and copper having a purity of 99.9% by mass or more and an average particle size of 0.005 μm to 2.0 μm. The through electrode that is formed of a metal powder sintered body of the present invention is a compact that is formed by minute metal powder particles being firmly joined together while undergoing plastic deformation, and acts effectively as an electrode. Further, although the metal powder sintered body is comparatively dense, the metal powder sintered body can relieve applied stress because the metal powder sintered body has fine pores. Hence, in contrast to a through electrode composed of a pure bulk metal, the metal powder sintered body of the present invention has flexibility and durability with respect to thermal stress. In the present invention, durability with respect to thermal stress is secured by provision of the aforementioned plurality of minute through electrodes and the structure of the through electrodes.

The reason for setting the purity and particle size of the metal powder forming the metal powder sintered body within the aforementioned ranges is that if the purity of the powder is low the hardness of the powder will be high and it will be difficult for deformation and recrystallization of the powder to proceed during formation of the sintered body, and the denseness will decrease. Further, with regard to the particle size also, if the powder has a coarse particle size, the denseness after sintering will decrease. Although the through electrode in the present invention is aimed at relieving stress by adopting a porous structure having pores, denseness is necessary. If the pores of the through electrodes become coarse and are lacking in denseness, not only will the electrical conductivity decrease, but there is also a risk that there will be a substantive deficiency in strength. The aforementioned purity and average particle size of the metal powder are necessary to obtain a metal powder sintered body that has a stress relieving action while securing the strength and electrical conductivity required as a through electrode. Further, the reason for adopting gold, silver and copper as the kinds of metal of the metal powder that is the constituent metal of the electrode is that these metals are favorable as electrode material and also have good plastic deformability when formed as a sintered body.

As described above, the metal powder sintered body that constitutes the through electrode of the present invention has appropriate pores for obtaining a stress relieving action while securing strength. As the specific criterion therefor, the porosity (void ratio) of the metal powder sintered body is preferably 7% or more and 35% or less. This porosity is defined based on the area ratio of pores in the through electrode in an arbitrary cross-section. Measurement of the porosity can be performed, for example, by subjecting an arbitrary cross-section of the through electrode to microscopic observation or electron microscopic observation, and measuring the area ratio of pore portions within the observation region based on an obtained photograph. Software for image analysis can be used as suitable for the area ratio measurement.

(V) Bump at End of Through Electrode

In the present invention, a bump composed of a metal powder sintered body that has a wider width than the through electrode is provided at least at one of the end of the through electrode (see FIG. 2). The bump is a connection member for obtaining a stable electrical connection with a semiconductor chip, an integrated circuit, a power module, a multi-chip module or the like that is a member to be joined. In addition, the metal powder sintered body is densified by being pressurized and heated, and has an action of joining to a contacting material that accompanies diffusion of the metallic elements. That is, the bump also functions as a joining material that joins the interposer substrate and the member to be joined.

The bump is constituted by a metal powder sintered body including the same metal as the aforementioned through electrode. The reason for using the same metal as the through electrode is to ensure that strain (thermal strain) does not arise in a mutual manner when joined to the member to be joined. Further, the particle size and purity of the metal powder of the metal powder sintered body constituting the bump is made the same as in the case of the through electrode. Furthermore, the porosity of the bump is preferably 7% or more and 35% or less, similarly to the porosity of the through electrode.

As will be described later, the bump and the through electrode are formed by sintering a metal paste including a metal powder. Here, the sintering temperature range which can be set for bump formation is preferably made lower than the sintering temperature range which can be set for through electrode formation. This is because the function as a joining material of the bump is taken into consideration. In the sintering of the metal paste, by making the sintering temperature a high temperature, contact between metal powder particles and the joining together and growth of pores progress. In sintering at a low temperature, pores do not grow and the fine state of the pores is maintained. In order to secure the joining property of the bump, particularly the joining property at a comparatively low temperature, it is preferable that the diameter of the pores is small so as to increase the points of contact between the metal powder particles. Hence, the sintering temperature with respect to the bump is made a comparatively low temperature to secure a low-temperature joining property. Therefore, with respect to the pore diameter and the state of the metal powder, in some cases the material structure of the bump and the material structure of the through electrode differ from each other. Further, with respect to the porosity of the bump also, whilst the suitable range thereof is the same as the suitable range of the through electrode, in some cases the porosity of the bump and the porosity of the through electrode will differ depending on the method for producing the interposer substrate.

The outer appearance of the bump and the through electrode in the present invention will now be described with reference to FIG. 3. It is required that the bump has a wider width than the through electrode at a face which comes in contact the through electrode. The through electrode is a porous structure that has fine pores. Hence it is favorable to make the bump width larger than the diameter of the end of the through electrode in order to cause a load to be evenly transmitted over the entire end face of the through electrode when the member to be joined and the interposer substrate are joined. Note that, the respective widths of the through electrode and the bump referred to here are determined with respect to a cross-sectional shape in the vertical direction with respect to the substrate. Furthermore, the cross-sectional area of the bump (cross-sectional area in the horizontal direction at the boundary surface with the through electrode) is preferably within the range of 1.2 times or more to 9 times or less the cross-sectional area in the horizontal direction of the end of the through electrode.

The shape of the bump in the vertical direction and horizontal direction is not particularly limited. A cross section in the vertical direction may be a quadrilateral shape having a uniform width, or may be a trapezoidal shape or inverted trapezoidal shape or a circular shape in which the width varies. Further, the shape in a horizontal cross section may also be circular, or may be another shape.

(VI) Segment

A segment is formed by arranging together a plurality of the aforementioned through electrodes having a through-hole and a bump. The arrangement pattern of through-holes (through electrodes) formed in one segment can be arbitrarily set. An example of the arrangement pattern of through-holes in one segment is illustrated in FIG. 4(*a*). As illustrated in FIG. 4(*a*), the through-holes can be arranged so that the contour of the through-holes forms a geometric shape such as a circle or a polygon, or a linear shape (a straight line, a curve, a spiral) in outline. Further, since the plurality of through electrodes and bump constituting the segment form one unit of an electrical connection, adjacent bumps may be connected (FIG. 4(*b*)).

(VII) Other Optional Structures (VII-1) Metallized Film

When the aforementioned bump is formed, it is preferable that a metallized film including a metal is formed in a region of the base material surface where the base material and the bump come in contact. As described above, the metal powder sintered body constituting the bump acts as a joining material for joining the base material and the member to be joined. This joining action arises as the result of contact between metal powder particles and diffusion of metallic elements at contacting parts which is caused by pressurization and heating. By forming a metallized film at a contact surface between the base material and the bump, a high degree of adhesion occurs that is caused by thermal diffusion at the joining interface between the metal powder sintered body and the metallized film, and thus the aforementioned joining action can be enhanced. The metallized film also has an action that suppresses diffusion of the constituent metal (gold or the like) of the bump into the substrate, and in a case where there is a base film that is described later, also has an action that suppresses diffusion of the base film (titanium or the like) into the bump. Taking into consideration these actions, two or more layers of metal film which include different metals may be formed and adopted as the metallized film.

The metallized film is preferably formed of any one of gold, silver, copper, palladium, platinum and nickel having a purity of 99.9% by mass or more. The reason for making the purity of the metal of the metallized film 99.9% by mass or more is that, in the case of a metal with low purity, there is a risk that impurities will form an oxide film and spread on the surface of the metallized film and hinder joining. More preferably, the metallized film includes metal with the same material as the metal of the metal powder constituting the bump and the through electrode. Further, the thickness of the metallized film of a single layer or multiple layers is preferably set within a range of 10 nm to 1000 nm.

The metallized film preferably includes a bulk body metal for securing adhesiveness with respect to the bump, and is preferably a film formed by plating (electroplating or electroless plating), sputtering, vapor deposition, a CVD method or the like. Note that, the metallized film may include only one layer, or may have a multilayer structure. For example, a platinum film may be formed on the base material side, and a gold film may be formed thereon (bump side). In the case of adopting a multilayer structure, the metallized film on the bump side is preferably formed with the same material as the metal of the metal powder constituting the through electrode.

Further, the metallized film may be formed directly on the base material, or may be formed in a manner in which a base film is interposed between the substrate and the metallized film. The base film is formed for enhancing the adhesiveness between the metallized film and the substrate. A base film that includes titanium, chromium, tungsten, a titanium-tungsten alloy, or nickel is preferable as the base film. The base film is also preferably formed by plating, sputtering, vapor deposition, a CVD method or the like, and also preferably has a thickness of 10 nm to 1000 nm.

It suffices that the metallized film and the base film are formed at least on a contact surface between the bump and the base material. As mentioned above, this is because the metallized film is a film for enhancing the joining property between the bump and the base material. However, with the exception of a portion at which electrical isolation is required, the metallized film may be formed over a wide range that spreads beyond a contact surface between the bump and the base material. For example, the metallized film may be formed within a region that will serve as a segment. Further, the metallized film and the base film may be formed on the inner face of the through-hole. As described above, these metallic thin films are sometimes formed by sputtering or a CVD method or the like, and in some cases these metallic thin films are also formed on the inner face of the through-hole at the same time as being formed on a surface that contacts the bump. In the case of forming the metallized film and the base film in a region other than a contact surface between the bump and the base material also, the thickness of each metal film is set within the aforementioned range of the thickness for the respective metal films. Note that, the thickness of the metallized film or the base film can be confirmed and measured by subjecting a cross section of the interposer substrate to microscopic observation (SEM or the like).

(VII-2) Gap Between Through Electrode and Through-Hole Inner Face

Further, while the through electrode and the through-hole inner face may be in close contact, there may be a gap between the through-hole inner face and the through electrode (see FIG. 3). The influence of a difference between the respective coefficients of thermal expansion of the base material and the through electrode can sometimes be mitigated by the gap. Specifically, it is acceptable to have a gap having a clearance that is 1/1000 or more and 1/10 or less the hole diameter of the through-hole. It is not necessary for the clearance of the gap to be completely constant in the length direction of the through-hole, and it suffices that the clearance is within the aforementioned range. Note that, in this case the term "through-hole inner face" refers to the outermost surface on the inner side of the through-hole, and in a case where a metal film is formed on the inner wall of the through-hole, it is required that the clearance between the surface of the metal film and the through electrode is within the aforementioned range. Further, the term "hole diameter" refers to the diameter of the through-hole itself, and in a case where a metallized film or a base film has been formed on the inner wall of the through-hole, the thicknesses of those films is not included in the hole diameter.

B Method for Producing Interposer Substrate of Present Invention

Next, a method for producing the interposer substrate of the present invention will be described. As described in the foregoing, the interposer substrate of the present invention is characterized by the fact that a plurality of through electrodes are formed for one electrical connection, and by the fact that a sintered body of metal powder is used as the constituent material of the through electrodes and of a bump at the end of the through electrodes. In this regard, the method for forming the through-hole is the same as the method for forming a through-hole of a conventional interposer substrate. In other words, a feature of the method for producing the interposer substrate of the present invention is the method for forming the through electrode and the bump. With regard to the other processes, those processes are fundamentally the same as in the case of the conventional interposer substrates.

A process for forming a through electrode is a process in which a metal paste including a metal powder is applied onto a substrate having through-holes to thereby fill the metal paste into the through-holes, and thereafter the metal powder paste is dried and sintered. Further, with regard to formation of a bump at the end of the through electrode also, simultaneously with formation of the through electrode or after formation of the through electrode, metal paste is applied onto the end face of the through electrode, and the metal powder paste is dried and sintered. In the following description, the composition of the metal paste will be described, and thereafter a specific method for producing an interposer substrate that applies the metal paste will be described.

(1) Composition of Metal Paste for Forming Through Electrode and Bump

The basic components of the metal paste for forming a through electrode and a bump are: one or more kinds of metal powder selected from gold, silver, and copper having a purity of 99.9% by mass or more and an average particle size of 0.005 μm to 2.0 μm; and an organic solvent. As described above, the purity of the metal powder is set to 99.9% or more to take into consideration the deformability and the degree of sintering after formation into a sintered body, and also to take into consideration the securement of electrical conductivity. Further, the reason the average particle size of the metal powder is set to 0.005 μm to 2.0 μm is that if a metal powder with a particle size of more than 2.0 μm is filled into a minute through-hole, the distance between the metal powder particles will be large, and eventually it will be difficult to secure the necessary electrical conductivity. Furthermore, if the distance between the metal powder particles is large, it will also be difficult to secure the joining strength. On the other hand, a metal powder having a particle size that is less than 0.005 μm aggregates in the paste and is difficult to disperse, and in addition, the coefficient of contraction during sintering is large and it becomes difficult to fill a through-hole. Note that, the average particle size of the metal powder in the present invention can be obtained by determining the particle size at an integrated value of 50% in a particle size distribution obtained by the laser diffraction/scattering method, or by observing a plurality of metal powder particles by microscopic observation (SEM) and determining the average value of the particle sizes that are measured by a two-axis method.

As organic solvents for use in the metal paste, ester alcohols, terpineol, pine oil, butylcarbitol acetate, butylcarbitol, carbitol, perchlor and menthanol are preferable. These solvents are less aggressive toward a resist and also can volatilize at relatively low temperatures (less than 50° C.), facilitating drying after the application of the metal paste. In particular, perchlor allows for drying at room temperature and thus is particularly preferable.

With regard to the blending ratio between the metal powder and the organic solvent in the metal paste, preferably the metal powder and the organic solvent are blended at a blending ratio of 60% or more and 99% or less by mass for the metal powder, and 1% or more and 20% or less by mass for the organic solvent. The purpose of blending in such a ratio is to prevent aggregation of the metal powder and to also enable the supply of sufficient metal powder for forming an electrode. The blending ratio of the metal powder influences the difference in the volume of the through electrode between before and after sintering. The aforementioned gap between the through-hole inner face and the through electrode influences the blending ratio of the metal powder of the metal paste and the sintering conditions. To form a suitable gap, the blending ratio of the metal powder is more preferably 70% or more and 98% or less by mass.

Note that, the metal paste used in the present invention may also contain an additive. Examples of the additive include one or more kinds selected from acrylic resins, cellulose resins, and alkyd resins. Examples of the acrylic resins that may be mentioned include methyl methacrylate polymers, examples of the cellulose resins that may be mentioned include ethyl cellulose, and examples of the alkyd resins that may be mentioned include phthalic anhydride resin. These additives have an action that suppresses aggregation of the metal powder in the metal paste, and thus make the metal paste homogeneous. The added amount of the additive is preferably 2% by mass or less relative to the metal paste. Thus, the metal powder content can be made to fall within a range sufficient for filling a through-hole, while also maintaining a stable aggregation suppressing effect.

However, unlike common metal pastes widely used for the formation of wiring electrodes and a wiring pattern on a substrate surface and the like, the metal paste used in the present invention does not contain glass frit. The reason for not mixing glass frit into the metal paste is to form a dense through electrode and also not allow impurities, which may inhibit recrystallization, to remain in the electrode. Note that, the components other than the metal powder which constitute the metal paste, such as the organic solvent and the aforementioned additive that is optionally added, disappear in the drying or sintering process after filling, and thus do not becomes inhibiting factors like glass frit.

(2) Method for Producing Interposer Substrate of Present Invention which Applies Metal Paste Here, two specific and preferred forms will be described with respect to a process for producing the interposer substrate in which the aforementioned metal paste is applied.

(2-1) First Form of Method for Producing Interposer Substrate of Present Invention This production process is a process in which, after formation (piercing) of through-holes in a base material, the through electrodes and the bumps are formed at the same time. FIGS. 5(*a*) to (*e*) are views for describing an outline of this production process. A preferred method for applying the aforementioned metal paste as well as preferred sintering conditions will be described with respect to this process.

(a) Formation of Through-Holes in Base Material

A joining region and segments are set on the base material, and a plurality of through-holes are formed in each segment. Similarly to the interposer substrates, methods that can be applied as a method for forming the through-holes include laser processing, dry etching, wet etching, ultrasonic machining, drilling with a drill, and sandblasting. In the present invention, since it is required to form a plurality of minute through-holes adjacent to each other in a substrate composed of silicon or glass, laser processing, dry etching, or wet etching is preferable. Further, in the case of using a silicon base material as the base material, it is preferable to form an insulating layer such as a thermal oxide film after formation of the through-holes.

(b) Formation of Mask Pattern for Bump Formation

After formation of the through-holes, as necessary, a metallized film is formed on the base material. Plating, sputtering, vapor deposition, a CVD method or the like can be used as the method for forming the metallized film. Note that, at this stage, a metal film is sometimes formed on the inner wall of the through-holes along with the substrate surface.

In this first form, pattern formation is performed by masking for bump formation. Preparation of a mask pattern can be favorably performed by application and photoetching of a photosensitive masking material such as a photosensitive film or a photoresist.

(c) Application and Filling of Metal Paste

Next, a metal paste including the aforementioned metal powder is applied onto the base material, and the metal paste is filled inside the through-holes and into concave portions corresponding to bumps of the mask pattern. Application of the metal paste is performed by supplying a suitable amount of metal paste onto the substrate. At this time, a method that applies the paste by a spin coating method, a screen printing method, an ink-jet method or the like can be applied, or a method in which an adequate amount of metal paste is supplied and thereafter is spread with a spatula or the like can be applied. Further, to suitably perform filling into the through-holes, after an adequate amount of metal paste is supplied, mechanical vibration at a predetermined frequency may be applied to the metal paste. The basic form of the metal paste applied in the present invention is a form in which only metal powder is dispersed in an organic solvent, and thus in some cases the metal paste may have poor fluidity. Therefore, application of mechanical vibration is preferable in order to fill the metal paste into the through-holes without leaving any space therein. The frequency of the mechanical vibration applied to the metal paste is preferably set within the range of 60 Hz to 300 KHz. The fluidity of the metal paste can be improved by vibrations in this range.

As a specific technique for applying the metal paste while imparting mechanical vibrations thereto, after supplying or while supplying the metal paste onto the substrate, preferably a blade (spatula) that is caused to vibrate at the aforementioned frequency is brought into contact with the metal paste to spread the paste over the entire substrate. By applying mechanical vibrations directly to the metal paste, vibrations are applied to the metal powder in the metal paste, and thus the fluidity improves.

In addition, as a more preferred form for causing the metal paste to completely enter the inside of the through hole, the through-hole may be depressurized. As a method for depressurizing the through hole, preferably application is performed inside a depressurized chamber, or the back side (opposite side to the side on which the metal paste is to be applied) of the substrate is depressurized, and it is preferable to perform the depressurization so that the pressure within the through-holes becomes −10 kPa to −90 kPa. As a result of the above-described application of mechanical vibrations to the metal paste and depressurization of the through holes, the metal paste can be filled sufficiently in the through holes.

(d) Sintering of Metal Powder

After application of the metal paste, arbitrary drying of the metal paste can be performed. If sintering is performed immediately after application and filling of the metal paste, voids are formed due to rapid gas generation caused by volatilization of the organic solvent, which sometimes affects the shape of the sintered body. Further, when drying is once performed, the metal powder in the through-hole can be temporarily fixed. When drying is performed, the drying temperature is preferably less than 80° C., and it is also possible to perform drying at room temperature.

The heating temperature when the metal paste is sintered is preferably set to 80° C. or more and 100° C. or less. The reason for adopting this temperature range is that if the heating temperature is less than 80° C., sintering of the metal powder does not proceed, and through electrodes and bumps having a certain degree of denseness cannot be formed. Further, the sintering process of this first form is a process that simultaneously sinters the through electrodes and the bumps. If a sintering temperature that is more than 100° C. is set in this sintering process, the aforementioned growth of pores and the like will occur in the sintered bodies to serve as bumps, and the joining property will be impaired. In addition, there is a concern that sintering at a high temperature will impart damage to a mask pattern such as a resist. In consideration of these points, the upper limit of the sintering temperature in the first form is set to 100° C. Note that, the sintering time in this sintering process is preferably 10 mins or more and two hours or less.

(e) Other Processes

By performing the aforementioned sintering process, the metal powder is sintered and solidified, whereby through electrodes and bumps are formed. Thereafter, the basic form of the interposer substrate is made by removing the mask pattern. In a case where bumps are formed on only one side, a metallized film may be formed on the other side. Further, the thus-produced interposer substrate may be subjected to a hermetic sealing treatment using a resin or the like.

(2-2) Second Form of Method for Producing Interposer Substrate of Present Invention This production process is a process in which formation of through electrodes and formation of bumps are performed separately. Therefore, the process for sintering metal paste is performed twice. FIGS. 6(*a*) to (*e*) are views for describing an outline of this production process. Hereunder, each of these processes is described.

(a) Formation of Through-Holes in Base Material

In the second form also, first, the formation of through-holes in the base material and, as necessary, the formation of a metallized film are performed. Suitable processes of the method for forming the through-holes and the like are the same as in the above-described first form.

(b) Application and Filling of Metal Paste and Sintering (First Sintering Process)

In this second process, after forming through-holes in the base material and, as necessary, forming an insulating layer, the metal paste is applied onto the base material and the metal paste is filled into the through-holes. Further, in the case of forming a metallized film on the base material, a film-formation process is performed before metal paste application. A method for applying the metal paste as well as preferred specific conditions are the same as in the above-described first form.

After filling the metal paste into the through-holes, sintering for forming through electrodes is performed. In this second form, sintering is performed for through electrode formation and for bump formation, respectively, and the sintering process performed here is a first sintering process. Whilst the sintering temperature with respect to the metal powder in this first sintering process may be within the same temperature range (80° C. to 100° C.) as in the aforementioned first form, it is also possible to perform the sintering treatment at a higher temperature than the aforementioned temperature range of the first form. The second form is a process which produces the through electrodes and the bumps separately from each other, and since only sintering of through electrodes is performed in the first sintering process, it is not necessary to take into consideration a decrease in the joining property of the bumps. Further, since a mask pattern formed using a resist or the like is not present on the base material at this stage, it is also not necessary to take damage to the mask pattern into consideration. Therefore, the sintering temperature in the first sintering process can be made a comparatively high temperature. Specifically, the sintering temperature can be made 100° C. or more and 300° C. or less. By setting the sintering temperature to a high temperature in this way, sintering of the metal powder can be caused to progress to a greater depth, and strong through electrodes can be formed.

(c) Bump Formation (Mask Pattern Formation and Metal Paste Filling)

After the through electrodes have been formed, the bumps are formed thereon. Patterning using a resist or the like on the base material in which the through electrodes were formed is performed in a similar manner to the aforementioned first form, and thereafter the metal paste is applied. When the metal paste is applied at this time also, application under depressurization as well as imparting of mechanical vibrations can be performed.

(d) Sintering of Bumps (Second Sintering Process)

After applying the metal paste onto the mask pattern, drying is performed as appropriate, and a second sintering process for forming bumps is performed. As described in the foregoing, when the bumps are sintered, it is preferable to perform sintering at a comparatively low temperature to ensure the joining property (low-temperature joining property). Therefore, the sintering temperature in the present second sintering process is preferably 80° C. or more and 100° C. or less, similarly to the sintering temperature for forming the bumps in the first form. The sintering time is preferably set the same as in the first form.

(e) Other Processes

The metal powder of the bumps is sintered by performing the above process. Thereafter, the basic form of the interposer substrate is made by removing the mask pattern. In the present form also, metallized film formation or a hermetic sealing treatment can be performed with respect to one of the sides of the base material.

C Method for Producing Semiconductor Device Using Interposer Substrate of Present Invention The interposer substrate of the present invention that is described above is suitable for producing a semiconductor device in which a semiconductor element, an integrated circuit, a multi-chip module or a circuit board or the like is adopted as a member to be joined. That is, this method for producing a semiconductor device is a method for producing a device which includes a process of, by overlapping and joining one or a plurality of members to be joined having one or more connection parts, and one or more interposer substrates, electrically connecting the member to be joined and the interposer substrate, in which: the interposer substrate described above is used as the interposer substrate; the interposer substrate and the member to be joined are stacked; and the method includes a process of pressurizing the interposer substrate and/or the member to be joined at 1 MPa or more and 50 MPa or less from one direction or two directions, and heating at 150° C. or more and 250° C. or less to electrically connect the interposer substrate and the member to be joined.

In the metal powder sintered body constituting the bumps of the interposer substrate of the present invention, as a result of being pressurized and heated, along with sintering caused by contact between metal powder particles and diffusion of metallic elements, the contacting materials intimately contact and join together. This sintering and joining of the metal powder effectively occurs, in particular, at the outer circumferential portion of the bump which is preferentially compressed during pressurization. Further, by this joining, an electrical connection is established between the connection part of the member to be joined and the bump of the interposer substrate.

As described above, the conditions for pressurization and heating when joining is performed are a pressure of 1 MPa or more and 50 MPa or less and a heating temperature of 150° C. or more and 250° C. or less. If the pressure is less than 1 MPa or the heating temperature is less than 150° C., it will be difficult for sintering of the metal powder sintered body to occur, and the adhesiveness will also be poor and there is a risk that the joining strength will be insufficient. On the other hand, if pressurization and heating are performed with a pressure that is more than 50 MPa or a heating temperature that is more than 250° C., there is a concern that mechanical or thermal damage may occur in the semiconductor element or the like that is the member to be joined. Preferably, the time required for the joining treatment is set within a range of 1 minute or more and 60 minutes or less. Note that, the pressurizing force for the aforementioned condition is the pressurizing force applied to bumps formed on the interposer substrate, and is the pressurizing force applied to all the bumps to be pressurized in the joining process. That is, the total area of the areas of the bumps to be pressurized is applied as the area that is the reference for setting the pressurizing force.

By undergoing the aforementioned joining process, the metal powder sintered bodies constituting the respective bumps are subjected to sufficient compressive deformation, and the interposer substrate and the member to be joined are joined. Whilst joining may be completed in this state, in order to obtain a more firm joining strength, a post-heat treatment that heats the bumps may be performed after the joining process (post-sintering). Post-sintering is a treatment that is mainly performed for the purpose of additionally sintering the metal powder. By performing this treatment, pores inside the bumps can be substantially eliminated to further densify the bumps.

The heating temperature in the case of performing post-sintering is preferably 100° C. or more and 250° C. or less. If the heating temperature is less than 100° C., sintering and densification cannot be expected to progress. If the heating temperature is more than 250° C., there is a concern that the device will be damaged, and furthermore, sintering will progress excessively and the state will be one in which the bumps are too hard. The heating time for the post-sintering is preferably set to 10 minutes or more and 120 minutes or less. The post-sintering may be performed without pressurization or may be performed under pressurization. In the case of pressurizing, the pressurizing force is preferably set to 10 MPa or less.

In addition to enhancing the joining strength between the bumps and the member to be joined, another merit of post-sintering is that the treatment time in the joining process can be shortened. A certain period of time is required for heating for sintering of the metal powder in the joining process. Although pressurization is also performed at the same time in the joining process, the pressurization does not require so much time. If it is planned to perform post-sintering, in the joining process, treatment can be performed for a short time period with priority given to pressurization, and even if the heating is insufficient, the lack of heating time can be compensated for by the heating in the post-sintering process.

By being subjected to the above joining method and the post-sintering that is an arbitrary process, the interposer substrate and the member to be joined can be firmly joined, and at the same time an electrical connection is also established.

As described above, the interposer substrate of the present invention disperses and relieves thermal stress by providing a plurality of through electrodes with a small diameter that are composed of a metal powder sintered body, and thus the durability improves. The present invention, in particular, can be applied to mounting a semiconductor device such as a power device in which heat generation is large. Further, the substrate structure can be multilayered, and the wiring length of an element can be shortened, and the electrical characteristics of the semiconductor element can be effectively exerted.

DETAILED DESCRIPTION OF THE PREFERRED EMBODIMENTS

First Embodiment: Hereunder, a preferred embodiment of the present invention will be described. In the present embodiment, a metal paste that used gold powder as a metal powder was prepared, and an interposer substrate was produced based on the above-described second form (FIGS. 6(*a*)-6(*e*)). An evaluation test was then conducted to evaluate the joining strength of a semiconductor chip that used this interposer substrate.

Figure 1:
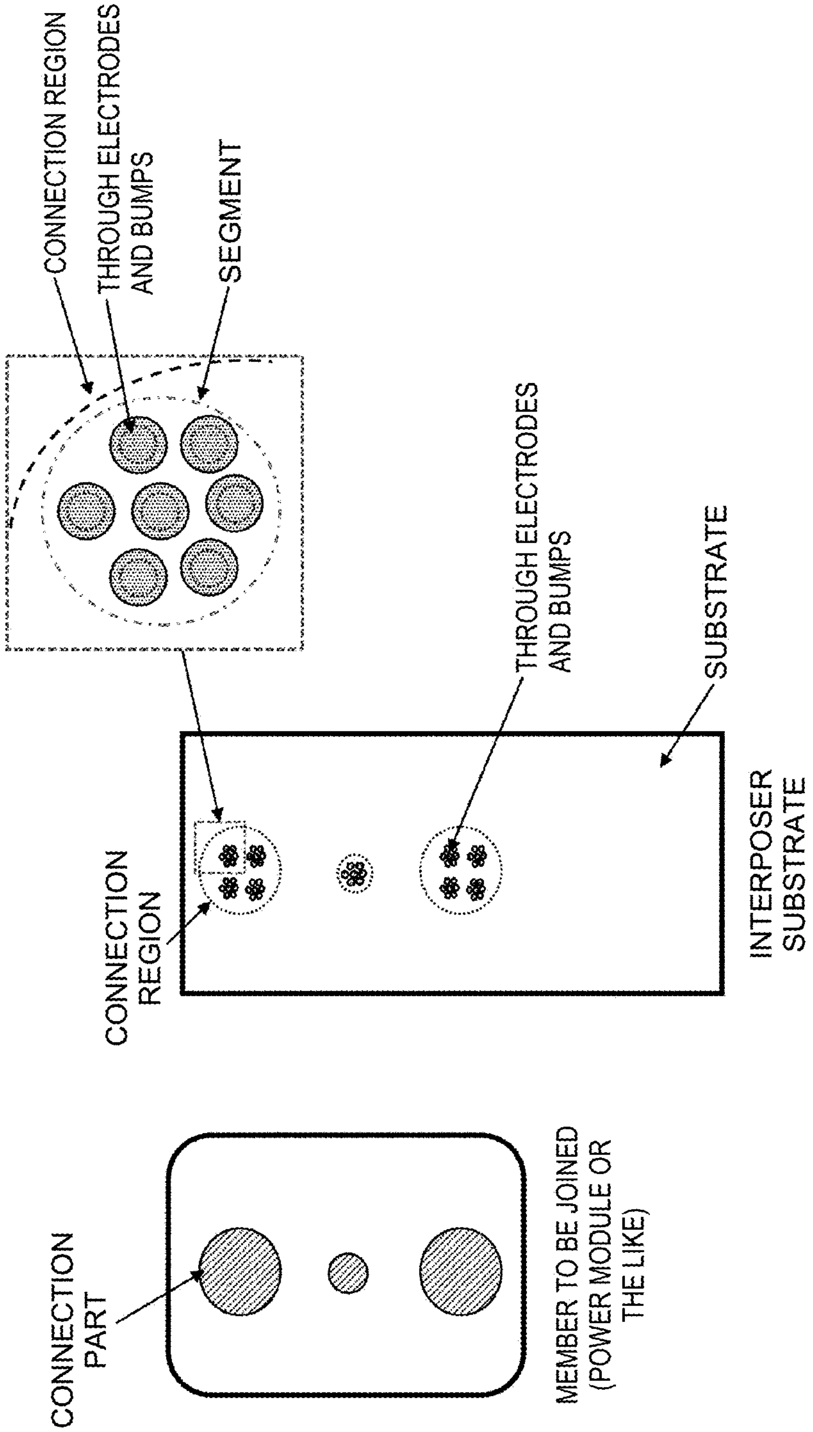
FIG. 1 is a diagram illustrating one example of the interposer substrate of the present invention and a member to be joined.
Figure 2:
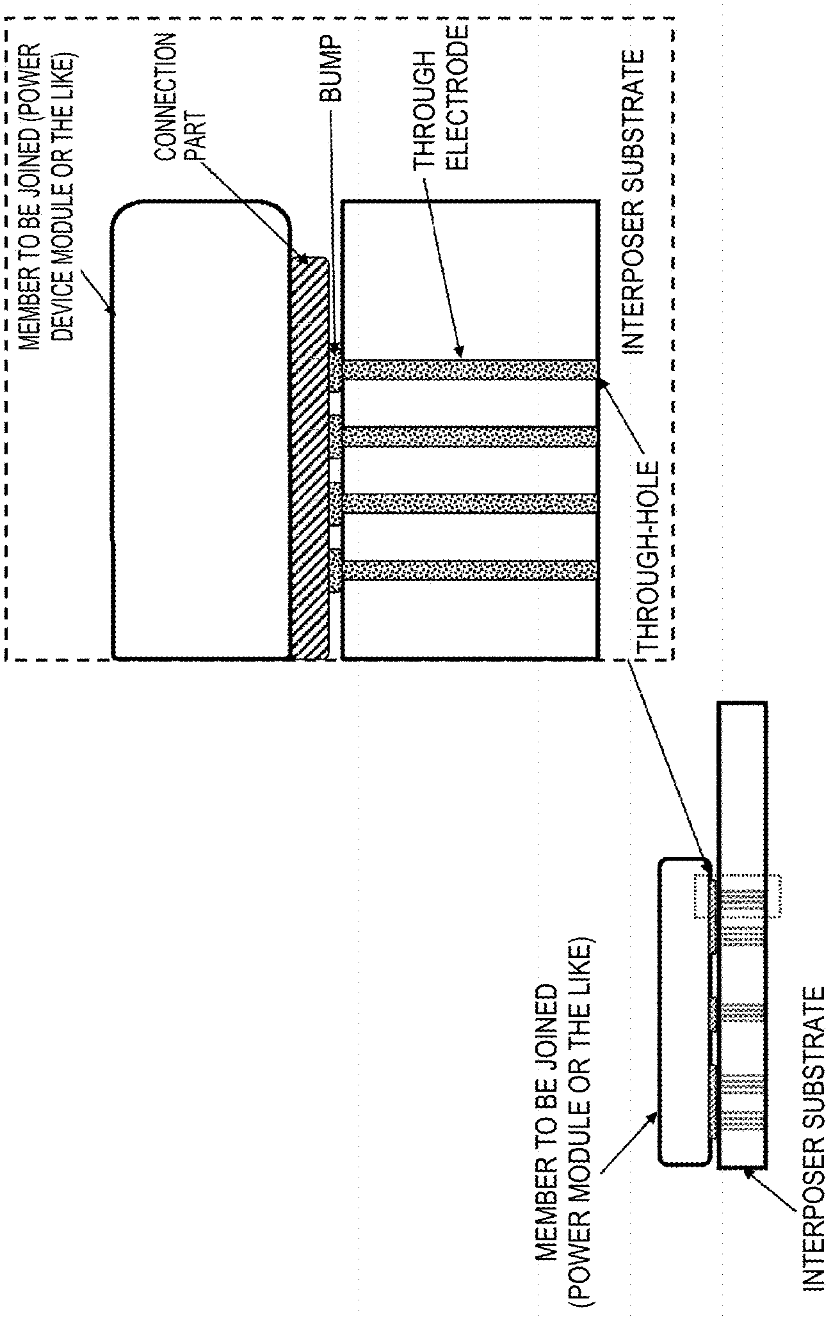
FIG. 2 is a diagram illustrating a state in which the interposer substrate is joined to the member to be joined (a power module or the like)
Figure 3:
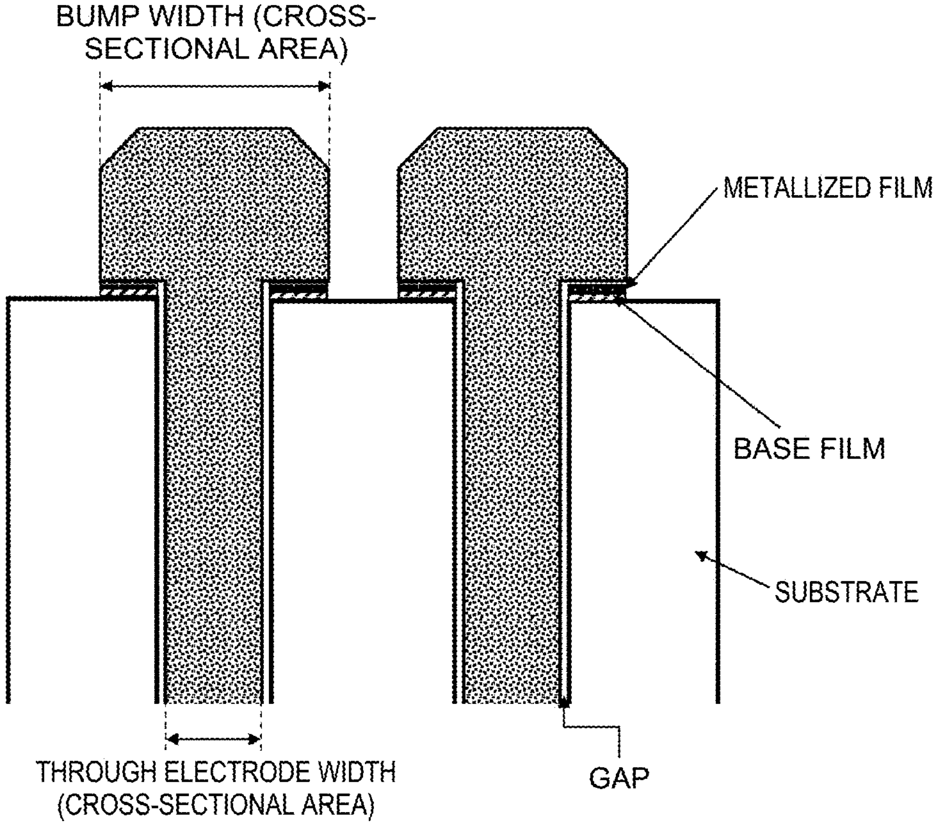
FIG. 3 is a diagram illustrating one form of a region around an end of a through electrode and a bump of the interposer substrate of the present invention.
Figure 4:
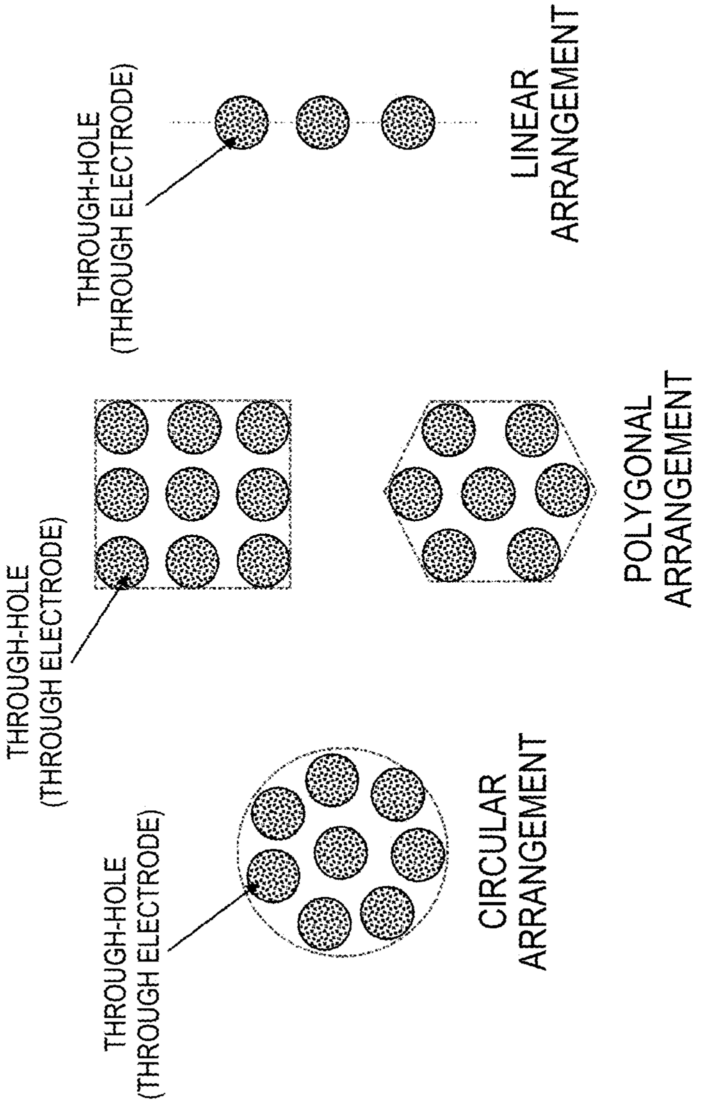
FIGS. 4(*a*) and 4(*b*) are diagrams illustrating examples of an arrangement pattern of through-holes and through electrodes in one segment as well as another form of a bump of the interposer substrate of the present invention.
Figure 4:
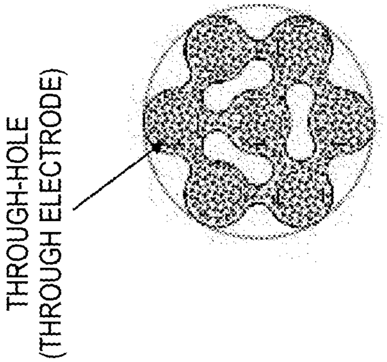
Figure 5:
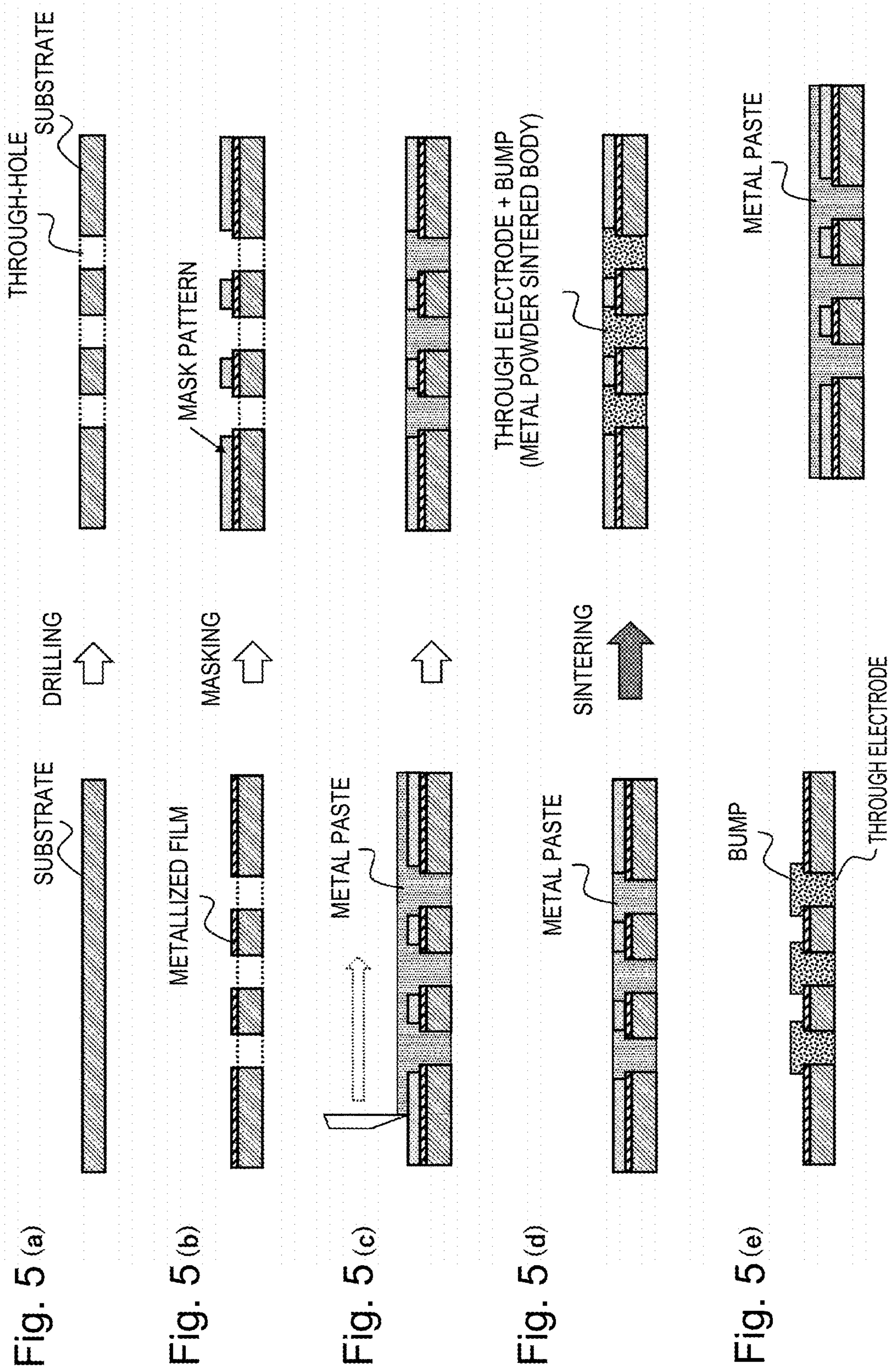
FIGS. 5(*a*)-5(*e*) are diagrams illustrating an outline of a first form of the method for producing an interposer substrate of the present invention.
Figures 6A, 6B, 6C, 6D, 6E:
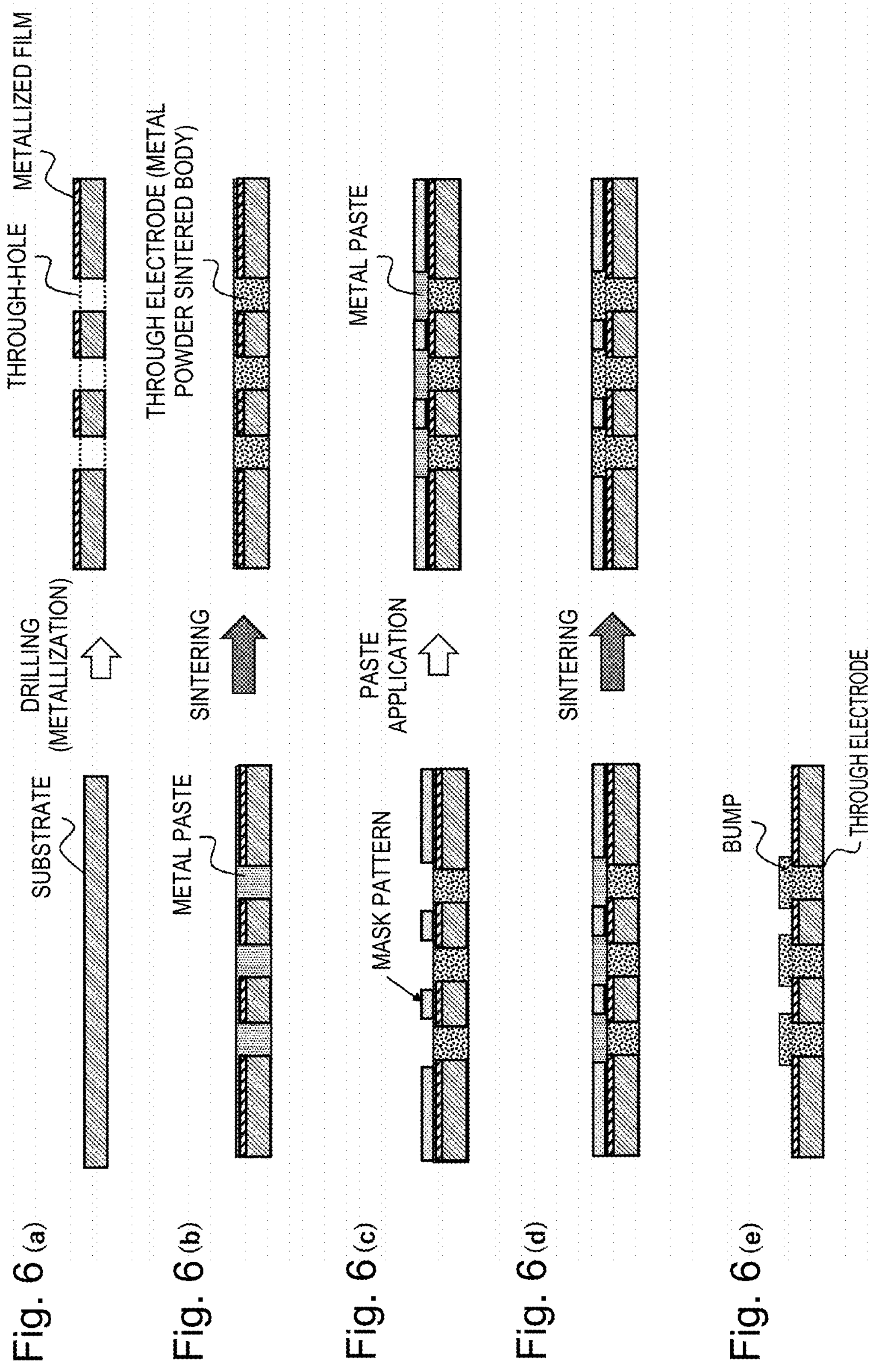
FIGS. 6(*a*)-6(*e*) are diagrams illustrating an outline of a second form of the method for producing an interposer substrate of the present invention.
Figure 7:
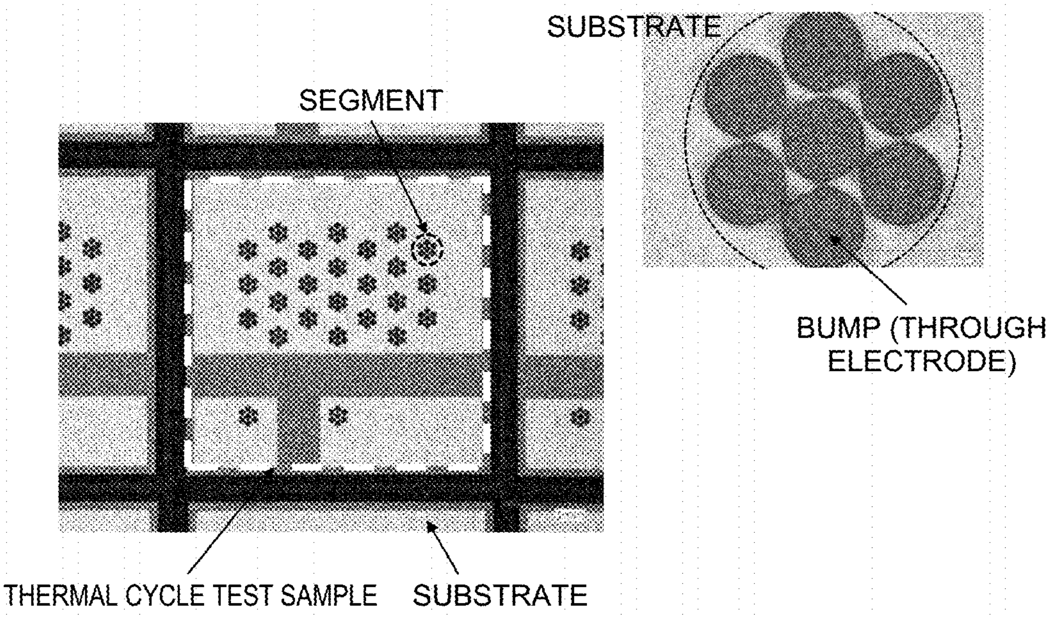
FIG. 7 is a diagram illustrating an arrangement pattern of segments and of through-holes of an interposer substrate produced according to the present embodiment.

First, an Si wafer (dimensions: 4 inches, thickness of 300 μm) was prepared as a base material, and through-holes were formed according to a predetermined pattern (see FIG. 6(*a*)). Here, as illustrated in FIG. 7, a pattern was adopted in which the number of through-holes in one segment was set at seven, and the contour of each through-hole was a hexagonal shape. Further, a place at which the aforementioned segment was formed in an arrangement of seven columns (numbers of segments in each column: 3-4-3-4-3-4-3), and places at which one independent segment was formed at two places was assumed as a joining region (number of through electrodes: 182). Formation of the through-holes was performed by forming a pattern using a photoresist, and then processing by dry etching. The through-hole was formed in the shape of a vertical hole, and the hole diameter was made 50 μm. After formation of the through-holes, the silicon base material was subjected to a heat treatment in the atmosphere, and a thermal oxide film was formed.

A base film was formed on one side of the silicon base material in which the through-holes were formed. As the base film, Ti (50 nm) was formed by a sputtering method, and then a metallized film of gold (300 nm) was formed (see FIG. 6(*b*)). At such time, together with the base material surface, these metal films were also formed on the inner wall of the through-holes.

Next, a metal paste was applied onto the base material and the metal paste was filled into the through-holes (see FIG. 6(*c*)). In the present embodiment, a metal paste (gold powder content: 90% by mass) prepared by mixing gold powder (average particle size as measured by SEM observation: 0.3 μm) having a purity of 99.99% by mass that was produced by a wet reduction process with tetrachloroethylene (product name: Asahi Perchlor) as an organic solvent was used. Application of the metal paste was performed by dripping the aforementioned metal paste onto the substrate, and spreading the metal paste over the entire surface of the substrate using a blade made of urethane rubber (blade width: 30 mm) vibrating at a frequency of 200 Hz. Further, this metal paste application process was performed while creating a reduced pressure atmosphere (−10 kPa to −90 kPa) on the back side of the substrate so that the paste applied on the surface of the substrate was sucked into the through-holes. After applying the metal paste, the entire substrate was dried at 70° C. for one hour, and thereafter was heated at 200° C. for 30 minutes to sinter the metal powder, thereby forming through electrodes.

Next, bumps were formed on the through electrodes. A photoresist (40 μm) was applied onto one side of the base material, and thereafter the circumference of each through electrode was exposed to light (750 $mJ/cm^2$, using a direct-writing exposure machine at a wavelength of 405 nm), and the photoresist was developed to form openings. At this time, the process was performed so that the diameter of the bumps became 80 μm. After this masking process, metal paste that was the same as the metal paste of the through electrodes was applied. The application method was basically the same as the method described above, and the metal paste was applied using a blade vibrating at a frequency of 170 Hz in a chamber depressurized to −65 kPa. After filling the metal paste into the spaces to become bumps, drying was performed in a similar manner to when the through electrodes are formed, and thereafter sintering treatment was performed at 100° C. for one hour (see FIG. 6(*d*)).

After forming bumps by the sintering treatment, the photoresist was removed to obtain the interposer substrate according to the present embodiment (see FIG. 6(*e*)). Note that, in the present embodiment, lastly a metal film of Ti and Au was formed by a sputtering process on the back side of the base material.

Figure 8:
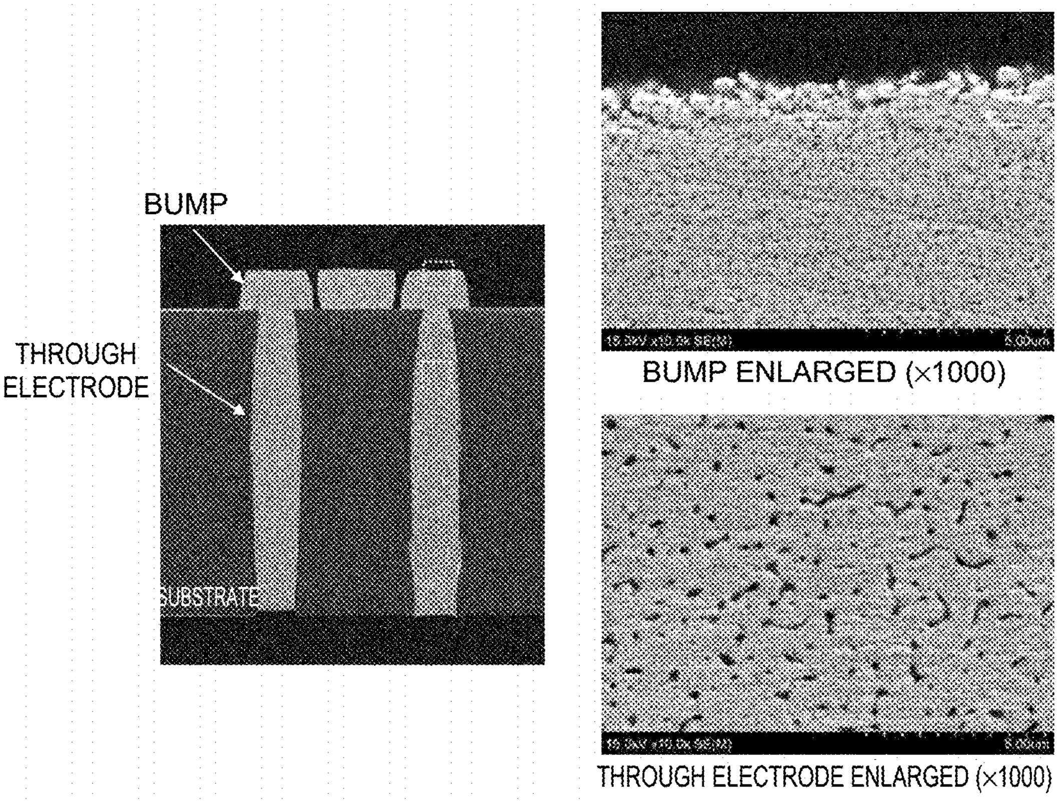
FIG. 8 shows photographs of cross-section structures a through electrode and a bump of an interposer substrate produced according to the present embodiment.
Figure 9:
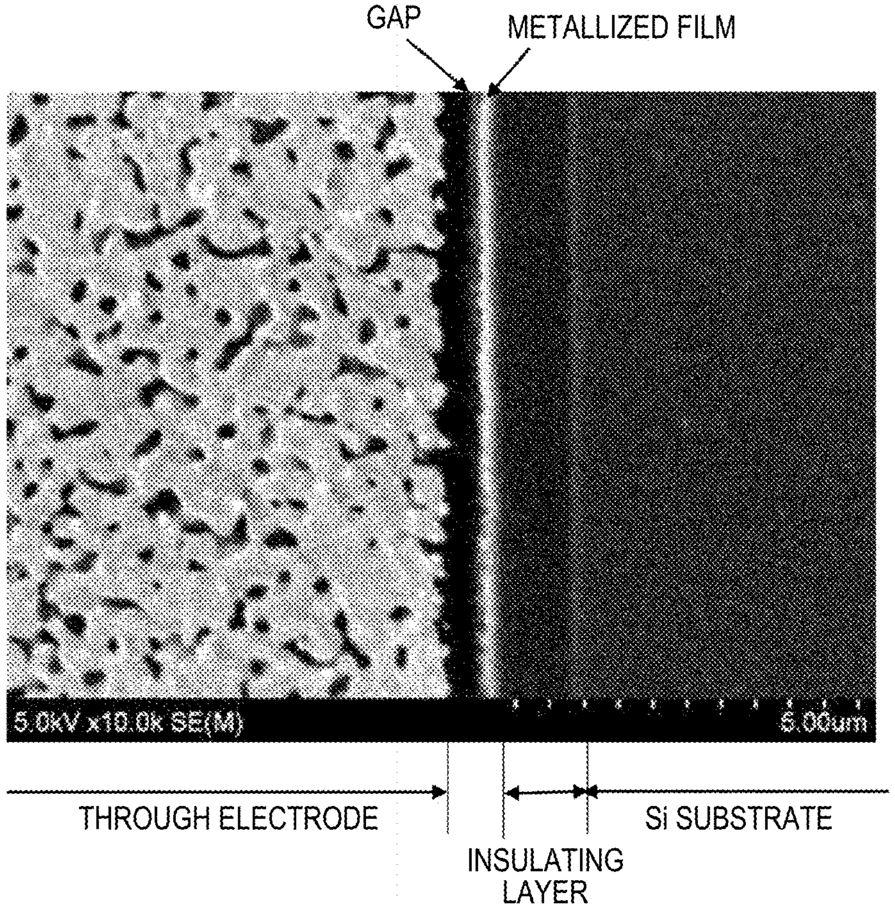
FIG. 9 is an enlarged photograph of the vicinity of a boundary between a through-hole inner face and a through electrode of an interposer substrate produced according to the present embodiment.

SEM photographs of cross-section structures of the through electrode and bump of the interposer substrate produced in the present embodiment are shown in FIG. 8. Further, an SEM photograph in which the vicinity of the boundary between the through-hole inner face and the through electrode is enlarged is shown in FIG. 9. Based on these photographs it is found that the through electrode and the bump have a material structure that has fine pores. Further, it was confirmed that there is a gap of approximately 0.5 μm between the through-hole inner face and the through electrode. It is considered that this gap arose because a slight amount of contraction occurred as the result of sintering the metal powder in the two sintering processes. In addition, the porosity was measured with respect to this through electrode and bump. The measurement was conducted by processing photographs (magnitude of ×5000) of the through electrode and the bump with image analysis software (name: ImageJ), and measuring the gross area of the pores. As a result, it was determined that the porosity of the through electrode was 15%, and the porosity of the bump was 11%. In the present embodiment, the through electrodes and the bumps were formed separately, with the through electrodes being sintered at a high temperature of 230° C., and the bumps being sintered at a low temperature of 100° C. It is considered that the porosity and pore diameter differed between the through electrodes and the bumps because of this difference in the sintering temperature.

[Thermal Cycle Test]

A semiconductor chip was joined to the interposer substrate produced as described above, to thereby produce a sample for evaluation, and the durability with respect to a thermal cycle load was evaluated. The produced interposer substrate was cut to prepare a sample (see FIG. 7), a semiconductor chip (Si wafer with a Ti/Au metallized film: dimensions of 10 mm×10 mm) was placed on the bump formation side of the sample, and heating and pressurization were performed to join the semiconductor chip to the interposer substrate. Three kinds of samples were produced for which the joining conditions were a heating temperature of 250° C., and a load of 3 MPa, 5 MPa, and 10 MPa respectively.

Each produced sample was subjected to a thermal cycle of −50° C. and 150° C. using a thermal cycle test machine, and the joining strength after a load of 1,000 cycles was measured. A value obtained by measuring the shear strength that shows the shearing stress was adopted as the joining strength. The sample was set in a shear strength testing device (bond tester), and the shear strength at a shear velocity of 100 μm/sec was measured.

Figure 10:
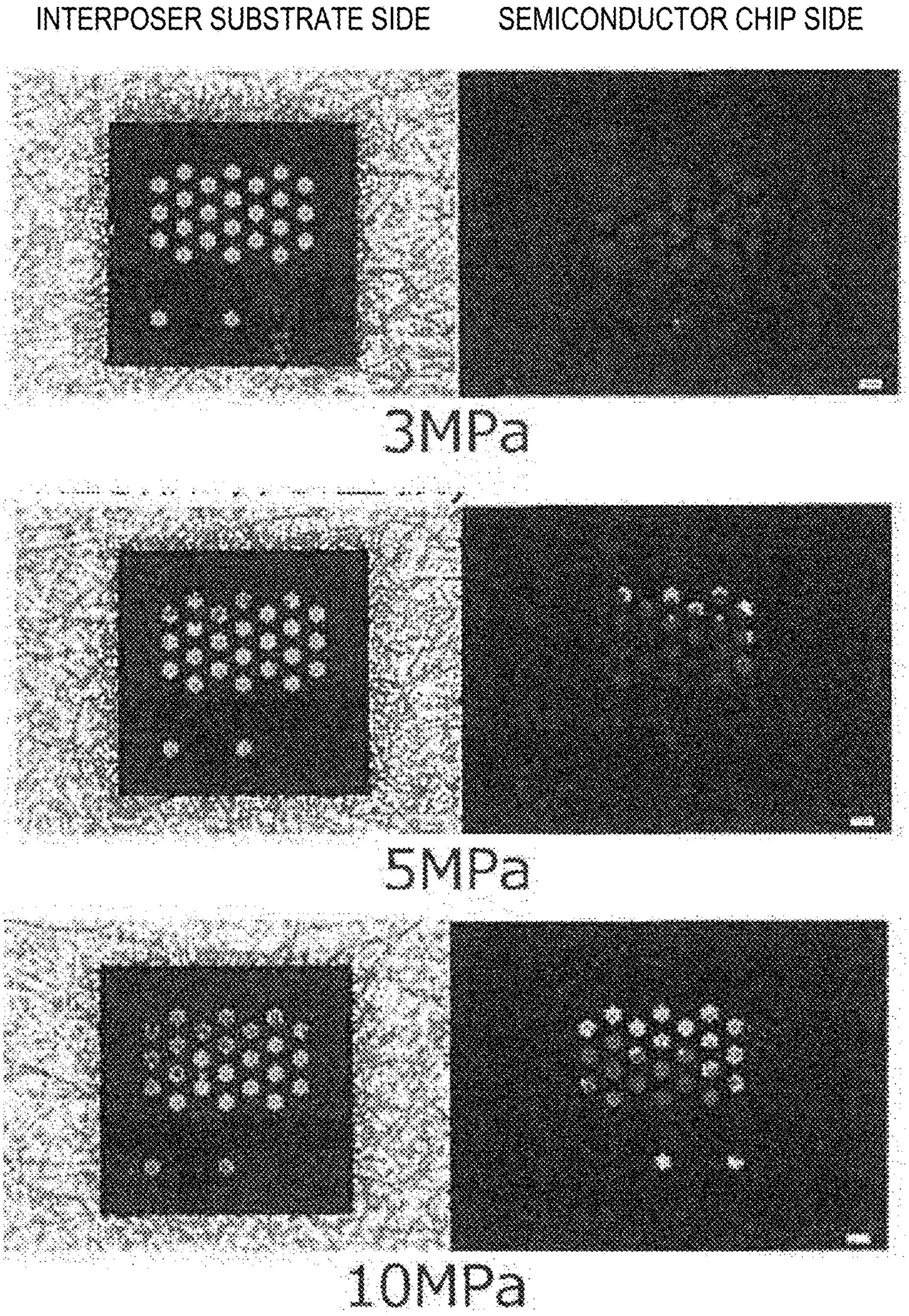
FIG. 10 shows photographs of the surface of an interposer substrate and a semiconductor chip after a thermal cycle test.
Figure 11:
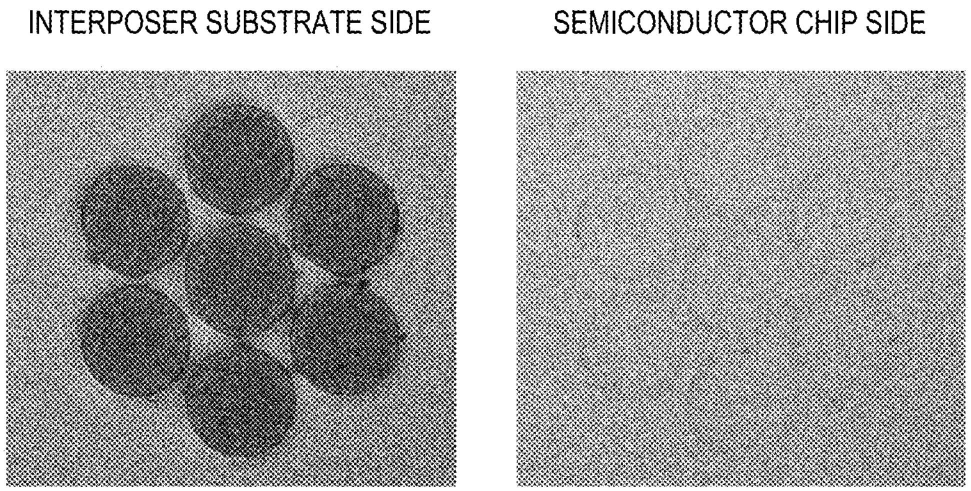
FIG. 11 shows enlarged photographs of one segment portion of the surface of an interposer substrate and a semiconductor chip after shear strength was measured after a thermal cycle load.

Photographs of the surface of the interposer substrates and the semiconductor chips after the shear strength measurement of each sample are shown in FIG. 10. Further, FIG. 11 shows enlarged photographs of the interposer substrate and the semiconductor chip after the shear strength measurement. Based on FIG. 10, it is found that accompanying an increase in the pressurizing force used when joining is performed, the amount of the metal powder constituting the bump which is transferred to the semiconductor chip increases. Further, referring to the surface shape of the bumps of the interposer substrate and the shape of the metal powder which transferred to the semiconductor chip side after shear strength measurement that are shown in FIG. 11, it is estimated that joining occurred mainly at the outer circumferential portion of the bumps.

Next, the joining strength between the interposer substrate and the semiconductor chip was evaluated for each of the aforementioned samples (joining load: 3 MPa, 5 MPa, and 10 MPa). In this evaluation, taking into consideration the fact that, as described above, joining between the interposer substrate and the semiconductor chip occurred mainly at the outer circumferential part of each bump, a bump outer circumferential area that was calculated by deducting the area of the through electrode at a center portion from the overall area of the bump was taken as a joining area that contributed to joining. Further, an area (0.54 $mm^2$) multiplied by the number (182) of through electrodes within the sample in the bump outer circumferential area was taken as the joining area. A value obtained by multiplying a measurement value obtained in a shear strength test by the aforementioned joining area was adopted as the joining strength between the interposer substrate and the semiconductor chip.

With regard to each of the aforementioned samples, the shear strengths that were the measurement values of the samples for which the joining loads were set to 3 MPa, 5 MPa, and 10 MPa, and the joining strengths calculated based on the shear test were 6.8 N (12.6 $N/mm^2$), 8.0 N (14.8 $N/mm^2$), and 17.4 N (32.2 $N/mm^2$), respectively. With regard to the joining strength between an interposer substrate and a semiconductor chip, the joining strength can be deemed to be sufficient if the joining strength is 10 N/mm$^2$ (10 MPa) or more. If the samples are evaluated taking this joining strength as the acceptable quality criterion, each of the samples is deemed to have exhibited sufficient joining strength. Based on the test results described above, it was confirmed that the interposer substrate produced in the present embodiment can maintain joining strength even when subjected to a thermal cycle load, and has good durability.

Second Embodiment: In the present embodiment, the kind of metal and the particle size of the metal powder for forming the through electrode and the bump were changed and a metal paste was produced, and thereafter an interposer substrate was produced based on the second form in a similar manner to the First Embodiment. The conditions for producing the metal paste and the conditions for producing the through electrode and the bump were basically the same as in the First Embodiment. However, the composition of the base film was appropriately changed. After the interposer substrate was produced, a joining strength test was conducted after subjecting the interposer substrate to thermal cycles (1,000 cycles) in a similar manner to the First Embodiment. In this joining strength test, the joining load was set to 0.8 MPa, 1.0 MPa, and 10 MPa, the joining strengths before and after the thermal cycle load were measured, and the relevant sample was evaluated as having passed the test if the joining strength after the load was 10 N/mm$^2$ or more. The test results are shown in Table 1.

TABLE 1

| | Through Electrode/Bump | | Base Film | | Metallized Film | | | Thermal Cycle Test Joining Strength | | |
|---|---|---|---|---|---|---|---|---|---|---|
| No. | Metal Powder | Particle Size (μm) | Metal | Thickness (nm) | Metal | Thickness (nm) | Joining Load (MPa) | Before | After | Evaluation |
| 1 | Au | 0.1 | Ti | 50 | Au | 300 | 0.8 | 10.0 | 8.0 | Failure |
| 2 | | | | | | | 1.0 | 13.0 | 11.0 | Pass |
| 3 | | | | | | | 10.0 | 32.0 | 30.0 | Pass |
| 4 | | | | 10 | | 10 | 0.8 | 8.0 | 4.0 | Failure |
| 5 | | | | | | | 1.0 | 12.0 | 11.0 | Pass |
| 6 | | | | | | | 10.0 | 25.0 | 22.0 | Pass |
| 7 | | 0.3 | Ti | 50 | Ag | 300 | 0.8 | 13.0 | 12.0 | Pass |
| 8 | | | | | | | 1.0 | 15.0 | 13.0 | Pass |
| 9 | | | | | | | 10.0 | 35.0 | 33.0 | Pass |
| 10 | | | | 10 | Pd | 10 | 0.8 | 12.0 | 10.0 | Pass |
| 11 | | | | | | | 1.0 | 14.0 | 13.0 | Pass |
| 12 | | | | | | | 10.0 | 26.0 | 23.0 | Pass |
| 13 | | | | 10 | Pt | 10 | 0.8 | 13.0 | 11.0 | Pass |
| 14 | | | | | | | 1.0 | 15.0 | 14.0 | Pass |
| 15 | | | | | | | 10.0 | 27.0 | 24.0 | Pass |
| 16 | | 2.0 | Ti | 50 | Au | 300 | 0.8 | 9.0 | 4.0 | Failure |
| 17 | | | | | | | 1.0 | 12.0 | 11.0 | Pass |
| 18 | | | | | | | 10.0 | 28.0 | 23.0 | Pass |
| 19 | | | | 10 | | 10 | 0.8 | 7.0 | 6.0 | Failure |
| 20 | | | | | | | 1.0 | 11.0 | 10.0 | Pass |
| 21 | | | | | | | 10.0 | 24.0 | 20.0 | Pass |
| 22 | | 2.5 | Ti | 50 | Au | 300 | 0.8 | 6.0 | 4.0 | Failure |
| 23 | | | | | | | 1.0 | 10.0 | 9.0 | Failure |
| 24 | | | | | | | 10.0 | 12.0 | 9.5 | Failure |
| 25 | | | | 10 | | 10 | 0.8 | 5.0 | 2.0 | Failure |
| 26 | | | | | | | 1.0 | 8.0 | 6.0 | Failure |
| 27 | | | | | | | 10.0 | 11.0 | 9.0 | Failure |
| 28 | Ag | 0.1 | Ti | 50 | Au | 300 | 0.8 | 15.0 | 14.0 | Pass |
| 29 | | | | | | | 1.0 | 20.0 | 18.0 | Pass |
| 30 | | | | | | | 10.0 | 25.0 | 22.0 | Pass |
| 31 | | | Cr/ | 10 | | 10 | 0.8 | 16.0 | 15.0 | Pass |
| 32 | | | Mo | | | | 1.0 | 21.0 | 20.0 | Pass |
| 33 | | | | | | | 10.0 | 26.0 | 21.0 | Pass |
| 34 | | | Ti | 50 | | 300 | 0.8 | 11.0 | 9.0 | Failure |
| 35 | | | | | | | 1.0 | 13.0 | 10.0 | Pass |
| 36 | | | | | | | 10.0 | 17.0 | 14.0 | Pass |
| 37 | Cu | 2.0 | Ti | 10 | Au | 10 | 0.8 | 7.0 | 3.0 | Failure |
| 38 | | | | | | | 1.0 | 11.0 | 10.0 | Pass |
| 39 | | | | | | | 10.0 | 15.0 | 13.0 | Pass |

*: Purity of metal powder is 99.9% by mass in each test.

Based on Table 1 it can be confirmed that in the interposer substrates in which through electrodes and bumps were formed from metal powder of gold, silver or copper having an appropriate particle size, a good joining force and durability were obtained. In cases where the particle size of the metal powder was more than 2.0 μm, the joining strength was less than 10 N/mm$^2$ after the thermal cycle load, and when the joining load was low, there were also some samples in which the strength was insufficient at the stage prior to the thermal cycle load (immediately after joining). This is considered to be because when the particle size of the metal powder was excessively large, gaps arose within the metal powder sintered body and the gaps remained after joining also, and consequently the strength of joined parts became low. Note that, with regard to the load in the joining process, when the load was set to less than 1.0 MPa, even in a case where the joining strength is obtained in some parts, the joining strength is liable to be lower overall. In order to obtain a stable joining strength, it is necessary to set the joining load to 1.0 MPa or more.

The present invention is drawn to an interposer substrate that is suitable for applying system-in-package techniques to semiconductor devices and for stacked mounting such as 2.5D mounting of semiconductor devices, and which is excellent in durability with respect to thermal stress caused by a thermal cycle. The present invention can meet the demand for size reduction and higher integration in semiconductor devices, in particular, high-current and high-load semiconductor devices such as power devices and LED devices. Hence, the present invention is expected to contribute to the automobile field and energy field in which power devices and the like are used.

What is claimed is:

1. An interposer substrate which is joined in an overlapping state to one or a plurality of members to be joined having a connection part at one or more places, and is electrically connected to the member to be joined,
- the interposer substrate comprising a base material having one or more connection regions corresponding to the connection part of the member to be joined, wherein
- a plurality of through-holes passing through the base material are formed in the connection region of the base material,
- a segment serving as one unit for the connection is constituted by the plurality of through-holes being formed adjacent to each other, with one or more of the segments being formed in the connection region,
- a through electrode passing through the through-hole, and a bump formed at least at one end of the through electrode and having a wider width, in a cross-sectional shape, than the through electrode are formed in each of the through-holes,
- the through electrode and the bump comprise a metal powder sintered body formed by sintering one or more kinds of metal powder selected from gold, silver and copper having a purity of 99.9% by mass or more and an average particle size of 0.005 μm to 2.0 μm, and
- between a through-hole inner face and the through electrode, the interposer substrate has a gap having a clearance of 1/1000 or more and 1/10 or less of a hole diameter of the through-hole.

2. The interposer substrate according to claim 1, comprising
- a metallized film comprising a metal in a region where the base material and the bump contact, wherein
- the metallized film comprises any one of gold, silver, copper, palladium, platinum and nickel having a purity of 99.9% by mass or more, and
- a thickness of the metallized film is 10 nm or more and 1000 nm or less.

3. The interposer substrate according to claim 2, further comprising
- a base film between the metallized film and the base material, wherein
- the base film comprises any one of titanium, chromium, tungsten, a titanium-tungsten alloy, and nickel, and
- a thickness of the base film is 10 nm or more and 1000 nm or less.

4. The interposer substrate according to claim 3, wherein
- a cross-sectional area of the bump is 1.2 times or more and 9 times or less a cross-sectional area of the end of the through electrode.

5. The interposer substrate according to claim 3, wherein
- one segment comprises two or more and 20 or less through electrodes; and
- a contour formed by an arrangement of the two or more and 20 or less through electrodes is circular, polygonal or a linear.

6. The interposer substrate according to claim 3, wherein a porosity of the through electrode and the bump comprising a metal powder sintered body is 35% or less.

7. The interposer substrate according to claim 2, wherein
- a cross-sectional area of the bump is 1.2 times or more and 9 times or less a cross-sectional area of the end of the through electrode.

8. The interposer substrate according to claim 2, wherein
- one segment comprises two or more and 20 or less through electrodes; and
- a contour formed by an arrangement of the two or more and 20 or less through electrodes is circular, polygonal or a linear.

9. The interposer substrate according to claim 2, wherein a porosity of the through electrode and the bump comprising a metal powder sintered body is 35% or less.

10. The interposer substrate according to claim 1, wherein
- a cross-sectional area of the bump is 1.2 times or more and 9 times or less a cross-sectional area of the end of the through electrode.

11. The interposer substrate according to claim 10, wherein
- one segment comprises two or more and 20 or less through electrodes; and
- a contour formed by an arrangement of the two or more and 20 or less through electrodes is circular, polygonal or a linear.

12. The interposer substrate according to claim 1, wherein
- one segment comprises two or more and 20 or less through electrodes; and
- a contour formed by an arrangement of the two or more and 20 or less through electrodes is circular, polygonal or a linear.

13. The interposer substrate according to claim 1, wherein a porosity of the through electrode and the bump comprising a metal powder sintered body is 35% or less.

14. A method for producing a device comprising a process of electrically connecting the member to be joined and the interposer substrate by overlapping and joining one or a plurality of members to be joined having one or more connection parts and one or more interposer substrates, wherein the method comprising the steps of:
- using the interposer substrate defined in claim 1 as the interposer substrate;
- stacking the interposer substrate and the member to be joined; and
- pressurizing the interposer substrate and/or the member to be joined at 1 MPa or more and 50 MPa or less from one direction or two directions, and heating at 150° C. or more and 250° C. or less to electrically connect the interposer substrate and the member to be joined.

* * * * *